“‑type ZnMgSSE”,

United States Patent [19]

Naniwae

[11] Patent Number: 5,773,850
[45] Date of Patent: Jun. 30, 1998

[54] SEMICONDUCTOR DEVICE HAVING A ZNCDSE BUFFER LAYER WITH A II-VI COMPOUND SEMICONDUCTOR LAYER CONTAINING TE GROWN THEREON

[75] Inventor: Koichi Naniwae, Tokyo, Japan

[73] Assignee: NEC Corporation, Tokyo, Japan

[21] Appl. No.: 852,283

[22] Filed: May 7, 1997

[30] Foreign Application Priority Data

May 10, 1996 [JP] Japan ................................. 8-116836

[51] Int. Cl.$^6$ ................................................. H01L 29/267
[52] U.S. Cl. ........................... 257/78; 257/200; 257/190; 257/201; 257/103
[58] Field of Search ............................. 257/78, 190, 200, 257/201, 103

[56] References Cited

U.S. PATENT DOCUMENTS 5,371,409  12/1994  McCaldin et al. ...................... 257/191

OTHER PUBLICATIONS

H. Okuyama et al., "Epitaxial growth of p–type ZnMgSSE", *Appl. Phys. Lett.,* vol. 64, No. 7, Feb. 14, 1994, pp. 904–906.
I.W. Tao et al., "Doping of ZnTe by molecular beam epitaxy", *Appl. Phys. Lett.,* vol. 64, No. 14, Apr. 4, 1994, pp. 1848–1849.
W. Faschinger et al., "Band structure engineering and doping of wide gap II–VI superlattices", *Appl. Phys. Lett.,* vol. 66, No. 19, May 8, 1995, pp. 2516–2518.

*Primary Examiner*—Jerome Jackson
*Assistant Examiner*—John F. Guay
*Attorney, Agent, or Firm*—Sughrue, Mion, Zinn, Macpeak & Seas, PLLC

[57] ABSTRACT

After the removal of a native oxide layer on a surface of an InP substrate, a ZnCdSe buffer layer is grown, and a ZnSeTe layer as a II–VI compound semiconductor layer containing Te is formed on the ZnCdSe buffer layer. This permits the ZnSeTe layer to grow two-dimensionally from directly after the start of growing such that its crystal quality is considerably improved. In this manner, a semiconductor device is attained which has above the InP substrate the II–VI compound semiconductor layer containing Te, which has such a high quality as to permit the semiconductor device to be used as a light emitting device.

3 Claims, 2 Drawing Sheets

SEMICONDUCTOR DEVICE HAVING A ZNCDSE BUFFER LAYER WITH A II–VI COMPOUND SEMICONDUCTOR LAYER CONTAINING TE GROWN THEREON

BACKGROUND OF THE INVENTION

1. Field of the Invention

The present invention relates to a semiconductor device which includes an InP substrate and a II–VI compound semiconductor layer containing Te, and more particularly to a semiconductor device which can be used as a light emitting device and which has a II–VI compound semiconductor layer containing Te.

2. Description of the Related Art

Using III–V compound semiconductors containing Group III elements such as Al, Ga, In, etc. and Group V elements such as As, P, Sb, etc. in a periodic table, semiconductor lasers for emitting laser beams of wavelengths in the ranges from infrared rays up to red light, light emitting diodes for emitting light of wavelengths in the ranges up to yellow-green light, and/or the like have been brought into practical use. However, in order to emit light having a shorter wavelength, a larger bandgap energy band is required. The above-described III–V compound semiconductors cannot satisfy this requirement.

II–VI compound semicondutors containing Group II elements such as Zn, Cd, Mg, etc. and Group VI elements such as S, Se, Te, etc. have relatively large bandgap energy, and can emit light of almost all wavelengths in a visible region. For this reason, II–VI compound semiconductors are anticipated as light emitting device materials for emitting light of wavelengths in the ranges especially from green light to ultraviolet rays. In recent years, research and development of these materials has been actively persued.

When forming such a II–VI compound semiconductor layer, since access to high-quality II–VI bulk substrate crystal is difficult, more accessible high-quality III–V bulk substrate crystal is generally used as a substrate. Among others, a GaAs substrate has a lattice constant approximate to ZnSe, a II–VI compound semiconductors. Using mixed crystals like ZnSSe and MgZnSSe, therefore, a double heterostructure can be formed under the lattice-matching condition. Thus, the GaAs substrate is most widely used as the substrate for a II–VI compound semiconductor growth. However, in case of compounds ZnSe, ZnSSe and MgZnSSe, an obtainable p-type carrier concentration is not sufficient to form practical devices, which is a bar to improvement in device characteristics (e.g. Appl. Phys. Lett.; Vol. 64, p. 904, 1994).

On the other hand, in case of those II–VI mixed crystals like ZnTe which contain Te, p-type crystals of high concentration can be formed relatively easily (e.g. Appl. Phys. Lett.; Vol. 64, p. 1848, 1994). This is because the energetic position of a valance band edge of ZnTe is higher than that of ZnSe related compounds. This indicates that in the case of a compound whose valance band edge is higher in energetic position than that of ZnSe as well, for example, in case of a Te containing mixed crystal like ZnSeTe, a p-type crystal having a higher carrier concentration than that of ZnSe can be formed. A part of this matter has already been proved (e.g. Appl. Phys. Lett.; Vol. 66, p.2516, 1995, etc.).

The lattices of ZnSeTe or MgZnSeTe among the II–VI mixed crystals containing Te do not match with those of the GaAs substrate most commonly used in the prior art, under which condition it is difficult to form a high-quality crystal. However, in case of ZnSeTe or MgZnSeTe, a lattice-matched mixed crystal can be grown if an InP substrate is employed. Moreover, ZnSeTe or MgZnSeTe, when being grown on the InP substrate so that the lattice thereof aligns with that of the InP substrate, has orange to ultraviolet band gap wavelengths (2.1 eV to 3.5 eV), and therefore is also anticipated as the material of a short-wavelength laser diode (LD). If a laser diode structure including a p-type cladding layer of such a mixed crystal can be formed on an InP substrate, the problem of insufficient p-type carrier concentration, which is a drawback of a II–VI light emitting device on the conventional GaAs substrate, can be solved.

FIG. 1 shows a semiconductor device wherein a ZnSeTe layer 3 is formed on an InP substrate by a conventional MBE (molecular beam epitaxy) method. The lattices of the ZnSeTe layer 3 align with those of InP substrate 1. Prior to the formation of ZnSeTe thin film 3 on InP substrate 1, a native oxide layer on a surface of the substrate is first removed, after which ZnSeTe layer 3 is grown directly thereon.

However, when a growing surface of ZnSeTe layer 3 formed by the above method is observed by reflection high energy electron diffraction (RHEED), the ZnSeTe layer 3 grows three-dimensionally for one minute or more directly after the start of growing, and then grows two-dimensionally. The three dimensionally growth mode causes a large number of crystal defects which is not desirable in the application of devices. Further, the full width at half maximum of the double crystal X-ray diffraction rocking curve (XRC) of the layer as formed is 150 sec or wider, the emission intensity of photoluminescence (PL) is very weak, and the quality of crystal is problematic in use as a light emitting device.

SUMMARY OF THE INVENTION

It is accordingly an object of the present invention to provide a semiconductor device which has above an InP substrate a II–VI compound semiconductor layer containing Te and having such a high quality as to permit the semiconductor device to be used as a light emitting device.

A semiconductor device according to the present invention comprises an InP substrate, a ZnCdSe buffer layer formed on the InP substrate, and a II–VI compound semiconductor layer containing Te and formed on the ZnCdSe buffer layer.

According to the present invention, when forming a II–VI semiconductor layer containing Te above an InP substrate, a native oxide layer on a surface of the InP substrate is removed, a ZnCdSe buffer layer is deposited, and then a II–VI thin film containing Te is grown on the ZnCdSe buffer layer.

In the present invention, after the native oxide layer on the surface of the InP substrate has been removed, the ZnCdSe layer which is easier than ZnSeTe in two-dimensionally growth from directly after the start of growing is grown as a buffer layer. This ensures considerably improved quality of the II–VI mixed crystal containing Te which is grown on the ZnCdSe buffer layer.

After the ZnCdSe buffer layer has been grown, the substrate temperature is raised, with the Se irradiation being performed, up to the temperature at which the II–VI layer containing Te is grown. After the substrate temperature has became stable, the growing of the layer is initiated. Under these conditions, a high-quality II–VI layer is easily obtained. Use of a substrate formed by depositing a GaInAs buffer layer on InP substrate facilitates the removal of the native oxide layer on the surface of the substrate, and therefore is more advantageous.

The above-described advantages do not depend on the thickness of the ZnCdSe layer. However, in view of the quality of the II–VI semiconductor layer containing Te, which is deposited on the ZnCdSe layer, it is preferred that the thickness of the ZnCdSe layer be less than such a critical thickness that crystal defects due to lattice-mismatching to InP substrate would occur.

Moreover, it is most preferred that the ZnCdSe layer is lattice-matched with the InP substrate.

DESCRIPTION OF THE PREFERRED EMBODIMENT

Embodiments of the present invention will now be specifically described with reference to the drawings.

Figure 1:
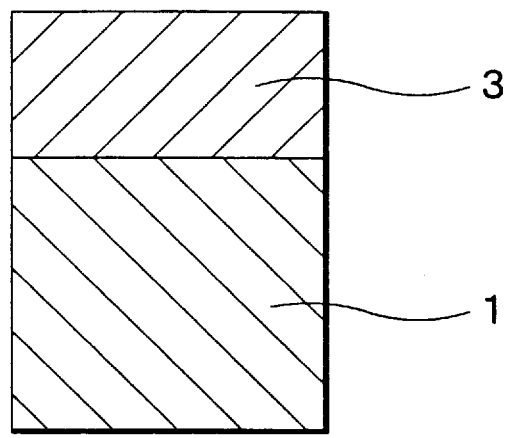
FIG. 1 is a sectional view of a convensional semiconductor device.
Figure 2:
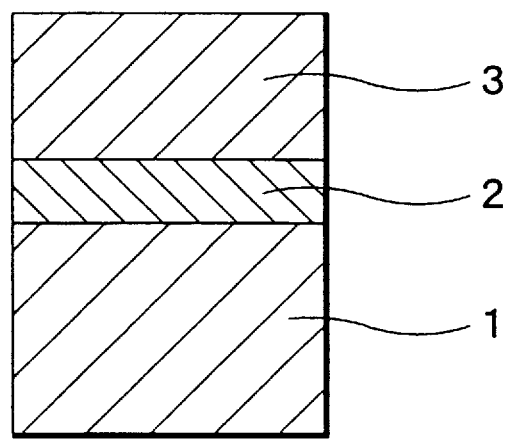
FIG. 2 is a sectional view of a semiconductor device according to a first embodiment of the present invention.

FIG. 2 shows the semiconductor device according to the first embodiment of the present invention. This semiconductor device includes an InP substrate 1, a ZnCdSe buffer layer 2 grown on the InP substrate, and a ZnSeTe layer 3 grown on the ZnCdSe buffer layer 2 as a II–VI compound semiconductor layer containing Te.

The above semiconductor device is manufactured in the following manner. After the removal of the native oxide layer on a surface of the InP substrate 1, the ZnCdSe buffer layer 2 having a given composition is grown, and the ZnSeTe layer 3 lattice-matched with the InP substrate 1 is formed on the ZnCdSe buffer layer 2. In this case, the ZnSeTe layer 3, when a growing surface thereof is observed by RHEED, grows two-dimensionally directly after the start of growing, and high quality ZnSeTe layer 3 having few crystal defects is obtained.

In this semiconductor device, the thickness (film thickness) of the ZnCdSe buffer layer 2 is set less than a critical thickness (critical film thickness) so that crystal defects due to lattice-mismatching between the InP substrate 1 and the ZnCdSe buffer layer 2 do not occur. In this embodiment, there is lattice-mismatching of 0.1% between the InP substrate 1 and the ZnCdSe buffer layer 2, and the film thickness of the ZnCdSe buffer layer 2 is on the order of 0.1 $\mu$m which is less than a critical film thickness of, in this case, 0.15 $\mu$m. Further, the critical film thickness of the ZnCdSe buffer layer 2 varies in accordance with the degree of lattice-mismatching between the InP substrate 1 and the ZnCdSe buffer layer 2, and can be calculated by, for example, the dynamical equilibrium theory studied by Matthews and Blakeslee and described in the Journal of Crystal Growth, Vol. 27, p.118, 1974. When the ZnSeTe layer 3, whose lattice constant is matched with that of the InP substrate 1, is formed on the ZnCdSe buffer layer 2, it can be confirmed by the surface observation by RHEED that the ZnSeTe layer 3 grows two-dimensionally from directly after the start of growing, and high quality ZnSeTe layer 3 having few crystal defects is attained.

Figure 3:
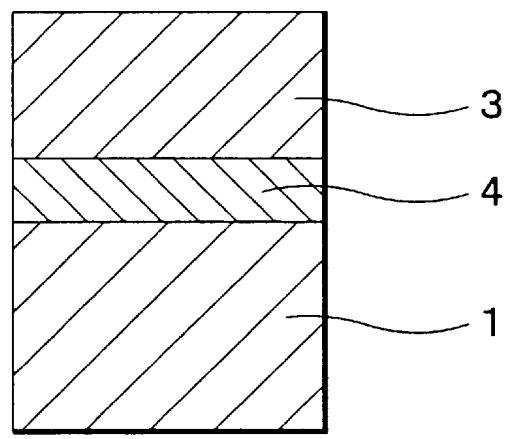
FIG. 3 is a cross sectional view of a semiconductor device according to a second embodiment of the present invention.

FIG. 3 is a sectional view of the semiconductor device according to the second embodiment of the present invention. This semiconductor device includes an InP substrate 1, an $Zn_{0.48}Cd_{0.52}Se$ buffer layer 4 grown on the InP substrate 1, and a ZnSeTe layer 3 grown on the $Zn_{0.48}Cd_{0.52}Se$ buffer layer 4 as a II–VI compound semiconductor layer containing Te.

This semiconductor device is manufactured in the following manner. After the removal of the native oxide layer on a surface of the InP substrate 1, the $Zn_{0.48}Cd_{0.52}Se$ buffer layer 4 having such a composition that the lattice constant thereof substantially match with that of the InP substrate 1, is deposited on the InP substrate 1, and the ZnSeTe layer 3 lattice-matched with the InP substrate 1 is grown on the $Zn_{0.48}Cd_{0.52}Se$ buffer layer 4. In this case also, it can be understood that the ZnSeTe layer 3, when a growing surface thereof is observed by RHEED, grows two-dimensionally from directly after the start of growing, and high quality ZnSeTe layer 3 having few crystal defects is attained.

The full width at half maximum of the double crystal X-ray diffraction rocking curve of the ZnSeTe layer 3 is on the order of 50 sec., which is not greater than 1/3 that of the prior art. The emission intensity of photoluminescence is at least one thousand times that of the ZnSeTe layer grown by the convensional method on the InP substrate. Thus, the ZnSeTe layer of considerably high quality, which is applicable to a light emitting device, is obtained.

In the above-described embodiment, it is explained how the ZnSeTe layer 3 is formed above the InP substrate 1. However, the present invention is applicable also to the case where in place of the ZnSeTe layer 3, another II–VI compound semiconductor layer like MgZnSeTe, MgZnSTe, MgCdSTe, ZnCdSeTe, ZnCdSTe, etc., whose lattice constant are matched with that of the InP substrate 1, is formed above the InP substrate 1. Moreover, the present invention is advantageous irrespective of the conductivity type of the ZnCdSe buffer layer 2 and the kind of an added impurity in the ZnCdSe buffer layer 2.

Figure 4:
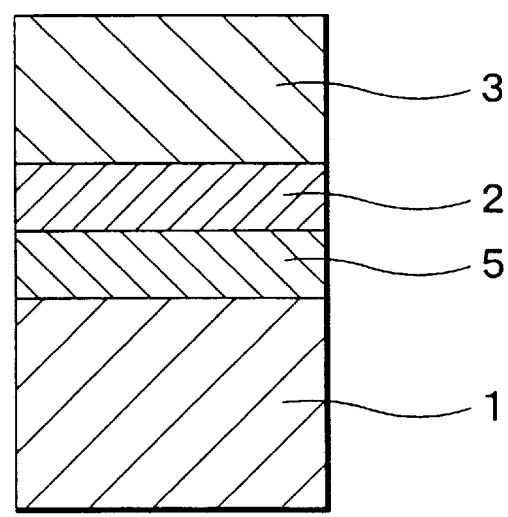
FIG. 4 is a cross sectional view of a third embodiment of the present invention.

Furthermore, a substrate formed by depositing a III–V compound semiconductor buffer layer like InGaAs on the InP substrate 1 may be used as a substrate on/above which the ZnCdSe buffer layer 2 is deposited. FIG. 4 shows a semiconductor device wherein an InGaAs layer 5 is formed on the InP substrate as the III–V compound semiconductor buffer layer and wherein a ZnCdSe buffer layer 2 and a ZnSeTe layer 3 are formed on/above the InGaAs layer 5. This semiconductor device has the same advantages as those of the semiconductor devices shown in FIGS. 2 and 3.

What is claimed is:
1. A semiconductor device comprising:

an InP substrate;

a ZnCdSe buffer layer formed on said InP substrate; and a II–VI compound semiconductor layer containing Te and formed on said ZnCdSe buffer layer.

2. The semiconductor device according to claim 1, wherein said ZnCdSe buffer layer has a thickness less than or equal to a critical thickness that a crystal defect due to lattice-mismatching occurs.

3. The semiconductor device according to claim 1, wherein said ZnCdSe buffer layer is formed on said InP substrate in a lattice-matched state with said InP substrate.

* * * * *